July 2, 1968 YU C. KAO ET AL 3,391,287

GUARD JUNCTIONS FOR P-N JUNCTION SEMICONDUCTOR DEVICES

Filed July 30, 1965 2 Sheets-Sheet 1

WITNESSES
Theodore F. Wrobel
James F. Young

INVENTORS
Yu C. Kao
& Elden D. Wolley
BY Gordon H. Telfer
ATTORNEY

United States Patent Office 3,391,287
Patented July 2, 1968

3,391,287
GUARD JUNCTIONS FOR P-N JUNCTION SEMICONDUCTOR DEVICES

Yu C. Kao, Penn Hills, and Elden D. Wolley, Monroeville Borough, Pitcairn, Pa., assignors to Westinghouse Electric Corporation, Pittsburgh, Pa., a corporation of Pennsylvania Filed July 30, 1965, Ser. No. 476,069
6 Claims. (Cl. 307—302)

ABSTRACT OF THE DISCLOSURE

Semiconductor devices are described having a guard junction surrounding a junction whose breakdown voltage is to be maximized by minimizing the chances of surface breakdown. Embodiments include those having a control electrode over an insulating layer between the guard junction and the main junction and, also, disposition of the guard junction on the opposite surface of the device from the main junction.

This invention relates to means for impeding surface breakdown in P-N junction devices, and more particularly to the incorporation of guard junctions into P-N junction devices for the purpose of preventing surface breakdown at a voltage lower than that at which breakdown occurs in the bulk material.

As is known, when a reverse bias is applied across a P-N junction, a depletion region exists resembling that in the space between the plates of a condenser. As the reverse bias is increased, the depletion region increases in width with the leakage current remaining relatively small and constant at first. However, when a critical voltage called the avalanche voltage is reached, a breakdown occurs and the current increases abruptly.

The present invention is particularly concerned with planar P-N junctions, especially high voltage planar diodes in which a region of one conductivity type is diffused into or otherwise formed in an area of the surface of a wafer of semiconductor material of the opposite conductivity type such that a P-N junction intersects the surface of the device at right angles. In many such devices intended for high voltage applications, surface breakdown occurs at a voltage lower than the bulk avalanche voltage; and since this breakdown is usually localized, these devices have low reverse current ratings at breakdown. Furthermore, such devices are easily destroyed if the voltage rating is exceeded. It has been shown that this is often the result of a greater electric field at the area where the junction intersects the surface than in the bulk of the semiconductor material.

The greater electric field at the surface of a planar diode and resultant lowering in reverse voltage rating occurs since, among other reasons, the junction always intersects the surface at right angles, yielding a high surface field which accentuates the problem of premature surface breakdown. Previous attempts at obtaining high voltage diodes involved making the junction intersect the surface at an angle other than a right angle, thus lowering the surface field. This was often accomplished in an uncontrolled manner by etching a mesa on a diffused wafer, or by groove etching, spin etching, electrolytic etching and the like. Other attempts at preventing surface breakdown involved isolating the edge of the junction from the bulk by a groove or shoulder which is "pinched off" by the depletion layer at a voltage below the breakdown voltage of the junction. While both of these methods are somewhat satisfactory, they each require specially controlled etching, lapping or machining techniques.

As an overall object, the present invention seeks to provide high voltage planar P-N junction devices in which junctions as in rectifiers, transistors, controlled rectifiers special manufacturing techniques.

Another object of the invention is to provide high voltage planar P-N junction devices in which the junction intersects the surface of the device at right angles.

A further object of the invention is to provide planar P-N junction devices utilizing an isolated guard junction or junctions of the same conductivity type as the diffused region used to produce the P-N junction and appropriately spaced in order to prevent surface breakdown, thereby increasing the voltage rating and reverse current surge rating of the primary P-N junction.

Still another object of the invention is to provide guard junctions for planar P-N junction devices which can be utilized to improve the reverse voltage ratings of all junction as in rectifiers, transistors, controlled rectifiers and alternating current switches.

Another object of the invention is to provide guard junction or junctions for planar P-N devices which can be fabricated in any manner in which the spacing between junctions can be controlled to give the desired "punch through" or dropping voltage.

Still another object of the invention is to provide a planar P-N junction device in which the maximum electric field on the surface of the device is decreased to increase the breakdown voltage of the device.

In accordance with the invention, a semiconductor wafer of one conductivity type is provided having a region of the other conductivity type diffused into, or otherwise formed in, a surface thereof to form a conventional P-N junction which intersects the surface of the wafer at right angles. Also formed in the wafer is a generally annular region of the other conductivity type which is spaced from the first-mentioned region by an amount such that it intersects the normal depletion region across the main P-N junction. In this manner, the electric field across the junction is effectively divided into parts, each of which has a lower maximum magnitude than the field across the junction without the addition of the annular guard junction. Since the breakdown voltage increases inversely with maximum electric field, it will be seen that as the maximum electric field is reduced by dividing it into parts, the breakdown voltage increases.

Preferably one or more annular guard junctions are formed in the same surface of the wafer as the region forming the main P-N junction. However, in certain devices the guard junction may be formed in the opposite side of the wafer—the important point being that in either case the guard junction or junctions intersect the normal depletion region that would otherwise be formed across the P-N junction without the addition of the guard junction. The use of guard junctions in accordance with the present invention avoids surface breakdown or, at least, makes surface breakdown occur at a higher voltage.

The above and other objects and features of the invention will become apparent from the following detailed description taken in connection with the accompanying drawings which form a part of this specification, and in which.

Figure 7:
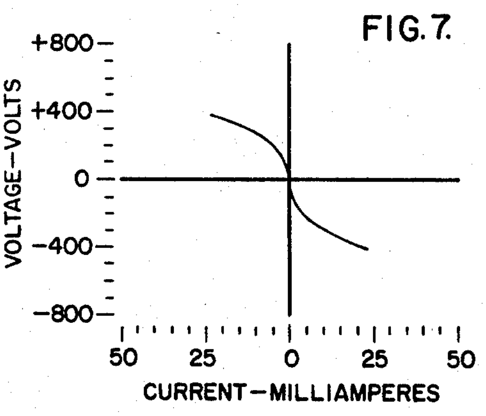
Figure 8:
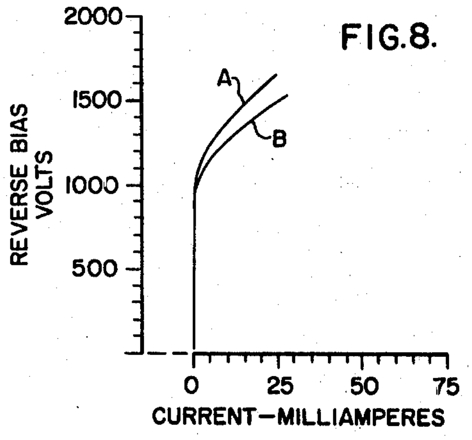

FIG. 7 is a graph illustrating the current-voltage characteristics between the guard junction and center junction of a device constructed in accordance with the teachings of the invention, showing punch through voltage; and FIG. 8 is a graph illustrating the current-voltage characteristics between the guard junction-base and central junction-base of a device constructed in accordance with the teachings of the present invention.

Figure 1:
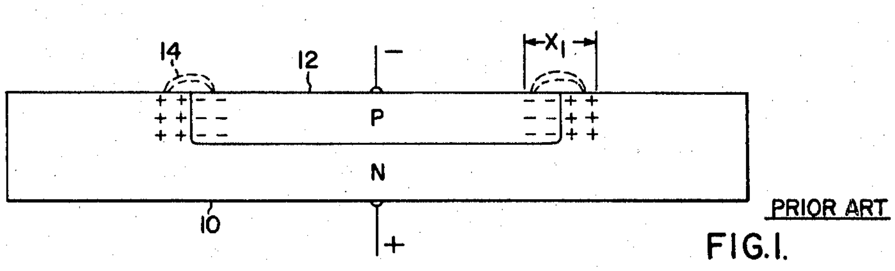
FIGURE 1 is a cross-sectional view of a conventional planar P-N junction device utilized for purposes of illustrating surface breakdown.

With reference now to the drawings, and particularly to FIG. 1, a conventional planar diode is shown comprising a wafer of N-type silicon 10 having diffused into its upper surface a P-type region 12. In accordance with conventional practice, the diode shown in FIG. 1 may be prepared by initially lapping and electropolishing the upper surface thereof prior to diffusion. Thereafter, an oxide coating is grown on the upper surface of the wafer; and an oxide window etched into the coating to expose the area to be diffused. Diffusion takes place by heating the wafer 10 with the oxide window formed thereon in the presence of a diffusant such as boron oxide ($B_2O_3$) or boron tribromide ($BBr_3$) whereby boron will be deposited on the surface of the wafer in the area of the oxide window. Further heating of the wafer 10 will cause the boron to diffuse into the wafer 10 to produce the P-type region 12.

When a reverse bias is applied across the P-N junction formed between the wafer 10 and region 12, an electric field will be formed which, as shown in FIG. 1, is represented by six negative charges in the P-type region 12 and six positive charges in the N-type wafer 10. Furthermore, an electric field 14 exists on the surface of the device across tahe P-N junction. As was explained above, this electric field is generally greater than that in the bulk of the device; and when the reverse bias is increased across the P-N junction, a surface breakdown occurs at a voltage lower than the bulk avalanche voltage due to the greater electric field 14 at the surface.

The region of the electric field across the P-N junction is called the space-charge region or depletion region and is indicated in FIG. 1 by the dimension $X_1$. It can be shown that the breakdown voltage is a function of the maximum electric field. The breakdown voltage is not linear but decreases rapidly with increasing field as a result of increasing probability of ionization of hole-electron pairs as the electric field increases. Furthermore, the maximum electric field can be decreased by increasing the length of the depletion region, thereby increasing the breakdown voltage. The present invention resides in the provision of means for "spreading out" the depletion region and decreasing the maximum electric field thereof such that the breakdown voltage will be increased. The surface breakdown problem is not substantially affected by whether the junction is formed by diffusion of a P-type region into an N-type substrate, as shown in FIG. 1, or the reverse.

Figures 2A, 2B, 3A:
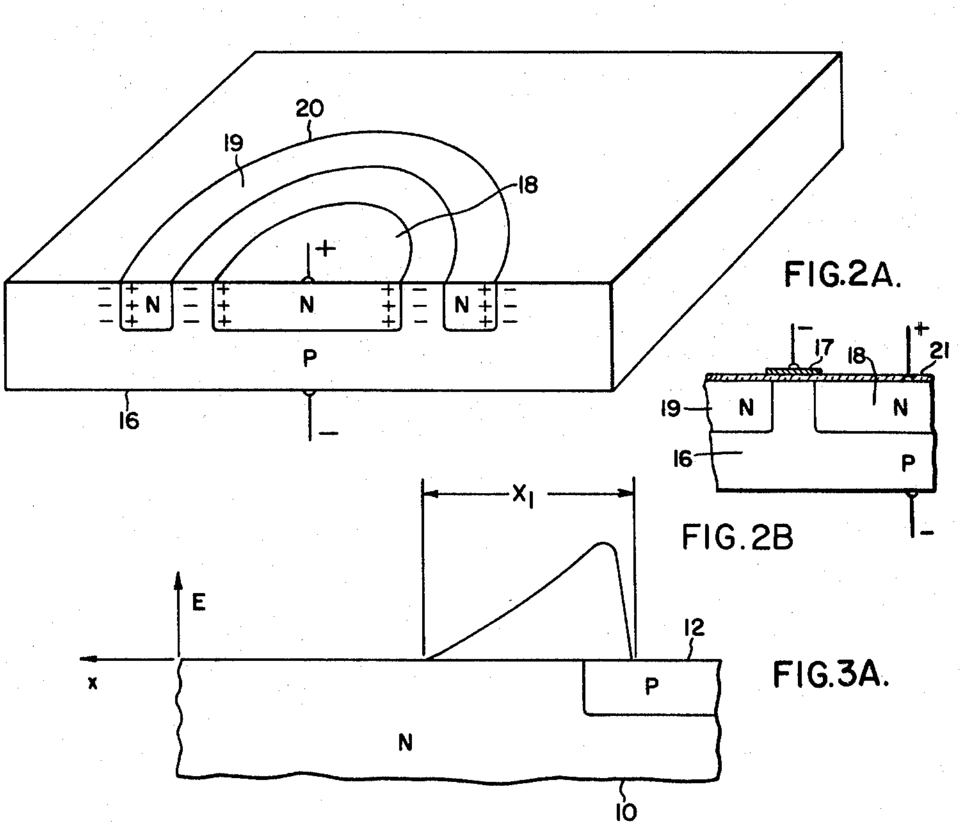
FIG. 2A is an isometric view of a P-N junction device utilizing a guard junction in accordance with the teachings of the present invention.
FIG. 2B is a partial, sectional view of a modified form of the device illustrated in FIG. 2A.
FIGS. 3A and 3B are cross-sectional views of semiconductor devices showing the profile of the electric field across a P–N junction with and without the guard junctions of the invention.

One means of spreading out the depletion region is shown in FIG. 2 wherein a wafer of P-type silicon 16 has diffused therein an N-type region 18. Surrounding the N-type region 18 is a guard junction 20 formed by region 19 which may be diffused into the wafer 16 simultaneously with the region 18 by simply etching an additional ring shaped window in an oxide layer bounding the window for region 18 prior to diffusion. In FIG. 2A, it will be assumed that the electric field across the junction between region 18 and the remainder of the wafer 16 is the same as that indicated in FIG. 1 with six negative charges in the P-type wafer 16 on one side of the junctions and six positive charges in the N-type regions 18 and 20. As a reverse voltage is increased across the P-N junction, the depletion region at the surface will widen until it "punches through" to the guard junction 20. It will be appreciated that as the reverse bias is further increased, the voltage on the surface between the N-type region 18 and the N-type region 19 will remain constant. Increased bias at the surface will, however, appear across the outer periphery of the guard junction 20. Hence, as illustrated in FIG. 2A, three electrons are on one side of the guard junction 20 while the remaining three are on the other side. Thus, the guard junction divides the surface voltage and hence, the electric field on the surface.

Figure 3B:
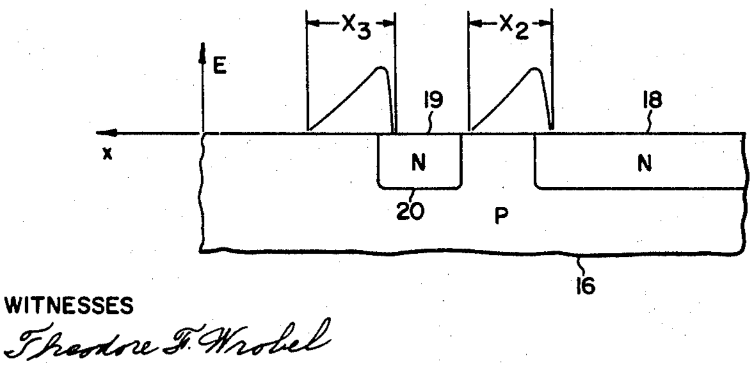

The effect can perhaps best be understood by reference to FIGS. 3A and 3B. In FIG. 3A no guard junction is employed; and the depletion region has the width, $X_1$. When the guard junction is employed as shown in FIG. 3B, the depletion region is divided into two parts having widths $X_2$ and $X_3$. In some cases, there may be no actual increase in the total depletion region width (i.e., $X_2+X_3$ may be no greater than $X_1$); however the maximum electric field, E, is clearly reduced as illustrated. This increases the breakdown voltage as is explained, for example, in McKay; "Avalanche Breakdown in Si"; Physical Review 94 (877) 1954.

Figure 4:
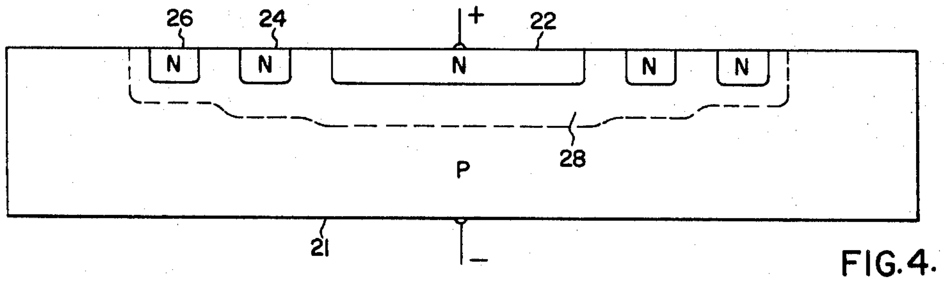
FIG. 4 is a cross-sectional view of a P-N junction with two guard junctions showing the depletion region after "punch through"

For very high voltage junctions (i.e., 1000 to 5000 volts), two or more guard junctions may be required around the main junction as shown in FIG. 4. In this case, a wafer of P-type silicon 21 has diffused therein an N-type region 22, the region 22 being surrounded by two regions 24 and 26 forming guard junctions. FIG. 4 also shows the extent of the depletion region 28 after "punch through" to both guard junctions 24 and 26; and it will be appreciated that the maximum electric field has been decreased further to further increase the breakdown voltage.

Figure 5:
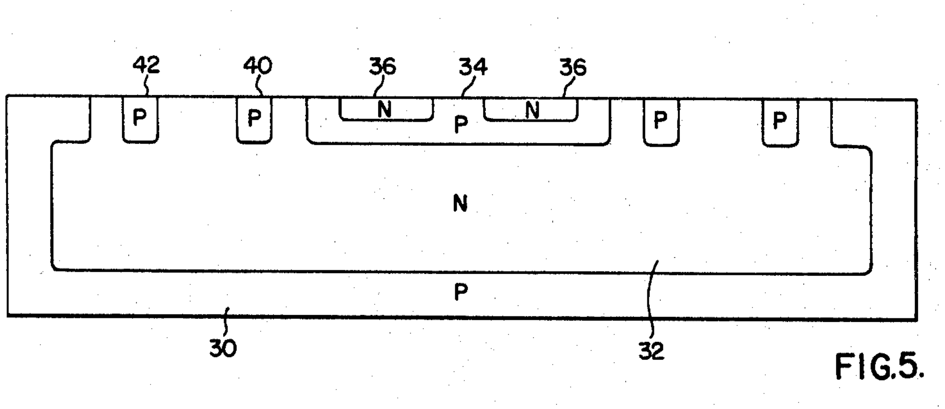
FIG. 5 is a cross-sectional view of a planar controlled rectifier with a guard junction for both the forward and reverse blocking junctions.

Planar guard junctions may also be used to obtain controlled rectifiers and alternating current switches with controlled avalanche properties in both the forward and reverse directions. FIG. 5 shows such an arrangement in a silicon controlled rectifier wherein a wafer of N-type silicon 32 has diffused therein a P-type region 30 on the bottom and sides thereof. Diffused into the N-type wafer 32 is a second P-type region 34 which may be diffused at the same time as region 30 and which, in turn, has an annular N-type region 36 diffused therein. In this case, a first annular region 40 forming a guard junction is formed around the P-type region 34 and a second annular region 42 forming a second guard junction is spaced around region 34 to increase the breakdown voltages of both the forward and reverse blocking junctions formed by regions 30 and 34 of the silicon controlled rectifier.

Figure 6:
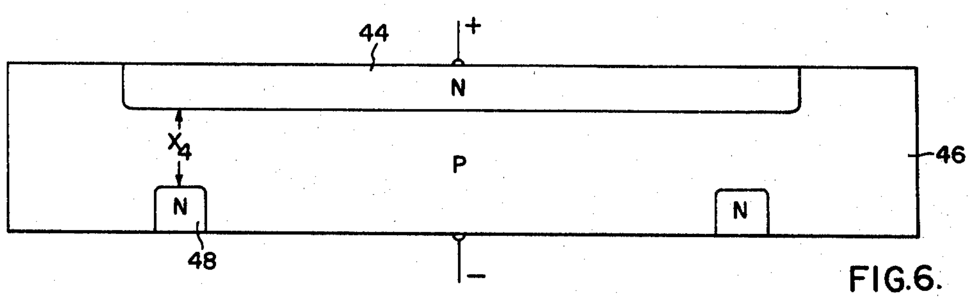
FIG. 6 is an illustration of a P-N junction device incorporating a guard junction on the side of a semiconductor wafer opposite the main junction.

FIG. 6 illustrates an alternate method of forming the guard junction which gives an additional degree of versatility in fabrication. In this case, an N-type region 44 is diffused into a P-type silicon wafer 46; however the annular guard junction 48 is diffused into the bottom surface of the wafer rather than in the top surface as in FIGS. 2A and 4, where it surrounds the diffused region. In this case, the "punch through" voltage is a function of the separation $X_4$ shown in FIG. 6. Using this method of fabrication, only a single guard junction can be formed, and not as much control over the "punch through" voltage is possible but in some instances such a configuration may be desirable.

At this point, it should be emphasized that the "punch through" voltage will be a function of the separation of the main and guard junctions, the base resistivity and the impurity profile in the junctions. Devices fabricated with a guard junction or junctions should be designed to limit the surface field to values which do not cause surface breakdown at a voltage less than that which will cause avalanche breakdown in the bulk. The guard junctions can be fabricated in any manner in which the spacing between the junctions can be controlled to within 1 to 2 mils. Formation of planar junctions using oxide masking and photolithographic techniques is the most adaptable solution and, since only a single mask is necessary for rectifiers, is highly suitable for production techniques. Another method of obtaining guard junctions is by alloying rings around a primary, central junction.

The width of the guard junction is not important and can be made as narrow as feasible in order to retain as much area on a wafer as possible for the main junction. For example, using photolithographic techniques and planar fabrication, three regions each of 2 mils width and 5 mils separation would require only 20 mils of space surrounding the main junction. The outer junction could be formed within 20 to 30 mils of the edge of the wafer; and the total of 40 to 50 mils is considerably less space than required for machining the shoulders, bevels or etch grooves as have been attempted with prior-art devices for impeding surface breakdown.

As a specific example of the invention, planar junctions with a planar guard junction were fabricated as follows:

(1) A P-type silicon wafer of 300 to 500 ohm-centimeter resistivity was initially lapped and electro-polished and then oxidized to form an oxide coating having a thickness of 12,000 Angstrom units.

(2) Windows were then etched in the oxide consisting of a dot of 130 mils diameter and a concentric ring spaced 7 mils away.

(3) A two-step phosphorus diffusion was carried out using $P_2O_5$ for the predeposition. After phosphorus was deposited on the surface of the wafer, it was heated to a temperature of 1200° C. for sixty-four hours to produce a phosphorus junction having a depth of about 2.2 mils.

(4) Aluminum and then silver were evaporated onto both the central and guard regions 18 and 19.

(5) The evaporated contacts, and aluminum-silicon contact with a molybdenum counterelectrode to the P-type base of the diodes, were alloyed at 700° C. for thirty minutes.

(6) The aluminum and silver between the junctions on the top surface were removed, the oxide was removed in hydrofluoric acid, and the silicon given a light etch in $19:1=HNO_3:HF$ for thirty seconds by using the negative of the mask used in forming the oxide windows.

The current-voltage characteristic between the central junction and the base, between the guard junction and the base, and between the central junction and guard junction, was observed on an oscilloscope, the results being shown in FIGS. 7 and 8.

FIG. 7 shows the current-voltage characteristic between the central junction and the guard junction derived by applying a voltage between the regions 18 and 19 of FIG. 2, for example. Note that as the voltage is increased between the regions 18 and 19, the current remains substantially constant and close to zero until a "punch through" voltage between 100 and 200 volts is reached. The "punch through" voltage is the same regardless of the polarization of the applied voltage.

In FIG. 8, the current-voltage characteristic is shown between the central junction and the base, and between the guard junction and the base, for the example given above. Curve A is the current-voltage characteristic between the central junction and the base; while curve B is the current-voltage characteristic between the guard junction and base. When the reverse voltage is increased to about 900 volts, breakthrough occurs between the guard junction and the base (curve B). On the other hand, breakthrough between the central junction (curve A) and the base does not occur until the reverse voltage has reached about 1100 volts. Accordingly, the reverse characteristic of the central junction is better than that of the guard junction by about 200 volts which is approximately the "punch through" voltage as indicated in FIG. 7. In the particular case illustrated, the reverse voltage of the central junction is limited by the surface leakage of the guard junction due to the fact that the bulk avalanche-breakdown voltage of the central junction is too high and the "punch through" voltage is too low. However, the principle of the guard junction is adequately illustrated; and it will be appreciated that in the example given the guard junction increases the rating of the device by about 200 volts.

The tests performed utilized a contact formed on the region 19 that produces the guard junction to secure the data shown in FIGS. 3A and 3B. In actual device operation such a contact is not necessary as the region 19 may be at a floating potential. Improvement in the breakdown voltage of a device will result whether the surface is oxide passivated or not. It is generally preferred to retain an insulating layer (such as the layer, usually of silicon dioxide, used as a diffusion mask in forming the junctions).

As shown in FIG. 2B, it is also desirable in some instances to apply a contact 17 on the oxide surface 21 over the surface between the main junction and the guard junction. A reverse bias applied to this contact 17 (e.g., negative when the substrate is P-type) will avoid channeling that may occur due to an inversion layer under the oxide on the semiconductor surface.

While the invention has been shown in connection with certain specific examples, it will be readily apparent to those skilled in the art that various changes in form and arrangement of parts may be made to suit requirements without departing from the spirit and scope of the invention.

We claim as our invention:

1. A semiconductor device comprising: a first region of semiconductor material of a first conductivity type; a second region of semiconductive material of a second conductive type adjoining said first region and forming a first P-N junction between said first and second regions; a third region of semiconductive material of said second conductivity type adjoining said first region and forming a second P-N junction between said first and third regions, said third region surrounding and spaced from said second region to improve the reverse blocking capability of said first P-N junction; a layer of insulating material over at least the surface portion of said first region between the terminations of said first and second P-N junctions; and a control electrode, not in contact with any of said regions, disposed on said insulating layer over said surface portion.

2. The subject matter of claim 1 wherein: said third region is free of electrical connection; a first electrical circuit connection across said device places a reverse bias across said first P-N junction; and a second electrical circuit connection to said control electrode provides a potential of a polarity to avoid an inversion layer in said surface portion.

3. The subject matter of claim 1 wherein: said device is a semiconductor diode and said first and second regions have load terminals connected thereto and said third region is free of electrical connection.

4. The subject matter of claim 1 wherein: a fourth region of said first conductivity type adjoins said second region and forms a third P-N junction therewith and a fifth region of said second conductivity type adjoins said first region and forms a fourth P-N junction therewith; and load terminals are connected to said fourth and fifth regions and said third region is free of electrical connection.

5. The subject matter of claim 4 wherein: said third region is free of electrical contact.

6. The subject matter of claim 4 wherein: said third region penetrates within said first region to intersect the normal depletion layer across said first P-N junction.

(References on following page)

References Cited

UNITED STATES PATENTS

| | | | |
|---|---|---|---|
| 3,113,220 | 12/1963 | Goulding et al. | 317—235 X |
| 3,271,201 | 9/1966 | Pomerantz | 317—235 X |
| 2,964,648 | 12/1960 | Doucette et al. | 317—235 |
| 3,035,186 | 5/1962 | Doucette | 317—235 |
| 3,226,612 | 12/1965 | Haenichen | 317—235 |
| 3,335,296 | 8/1967 | Smart | 317—235 |

FOREIGN PATENTS

| | | |
|---|---|---|
| 627,566 | 1/1963 | Belgium. |
| 915,688 | 1/1963 | Great Britain. |
| 924,121 | 4/1963 | Great Britain. |
| 1,361,215 | 4/1964 | France. |
| 1,377,910 | 9/1964 | France. |

OTHER REFERENCES

IBM Technical Disclosure Bulletin, vol. 5, No. 8, January 1963, page 94.

JOHN W. HUCKERT, *Primary Examiner.*

R. POLISSACK, *Assistant Examiner.*